United States Patent
Jeong (10) Patent No.: US 7,215,596 B2
(45) Date of Patent: May 8, 2007

(54) CIRCUIT AND METHOD FOR CONTROLLING INVERSION OF DELAY LOCKED LOOP AND DELAY LOCKED LOOP AND SYNCHRONOUS SEMICONDUCTOR MEMORY DEVICE USING THE SAME

(75) Inventor: Byung-Hoon Jeong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 11/000,940

(22) Filed: Dec. 2, 2004

(65) Prior Publication Data

US 2005/0141334 A1 Jun. 30, 2005

(30) Foreign Application Priority Data

Dec. 24, 2003 (KR) ............... 10-2003-0096385

(51) Int. Cl.
*G11C 8/00* (2006.01)
*G11C 8/18* (2006.01)
*H03L 7/06* (2006.01)
*H03K 7/08* (2006.01)

(52) U.S. Cl. ............ 365/233; 365/233.5; 365/230.08; 327/147; 327/149; 327/156; 327/175

(58) Field of Classification Search ............... 327/147, 327/149, 156, 175; 365/233, 233.5
See application file for complete search history.

(56) References Cited

U.S. PATENT DOCUMENTS

| | | | |
|---|---|---|---|
| 6,069,507 A | 5/2000 | Shen et al. | 327/156 |
| 6,392,458 B1 | 5/2002 | Miller, Jr. et al. | 327/158 |
| 6,404,248 B1* | 6/2002 | Yoneda | 327/158 |
| 6,542,609 B1* | 4/2003 | Ryan et al. | 380/210 |
| 2002/0003747 A1* | 1/2002 | Yahata et al. | 365/233 |
| 2002/0084818 A1* | 7/2002 | Cho | 327/175 |
| 2003/0219088 A1* | 11/2003 | Kwak | 375/376 |
| 2004/0041609 A1* | 3/2004 | Lin | 327/175 |

FOREIGN PATENT DOCUMENTS

JP        06188740 A * 7/1994

* cited by examiner

*Primary Examiner*—Huan Hoang
*Assistant Examiner*—Ly Duy Pham
(74) *Attorney, Agent, or Firm*—Volentine & Whitt, PLLC (57) ABSTRACT

A Delayed Lock Loop (DLL) circuit includes an inversion control circuit. The inversion control circuit includes an inversion decision circuit to determine the inversion of reproduction clock signal by comparing phases of an external clock signal and a reproduction clock signal, and to produce an inversion decision signal including a duty error margin for the reproduction clock signal. The inversion control circuit also includes an output latch to latch the inversion decision signal in synchronization with a start signal to produce an inversion control signal.

12 Claims, 7 Drawing Sheets

CIRCUIT AND METHOD FOR CONTROLLING INVERSION OF DELAY LOCKED LOOP AND DELAY LOCKED LOOP AND SYNCHRONOUS SEMICONDUCTOR MEMORY DEVICE USING THE SAME

BACKGROUND OF THE INVENTION

1. Field of the Invention

The present invention relates generally to a circuit and method for controlling inversion of a Delay Locked Loop (DLL), and a synchronous semiconductor memory device incorporating such a DLL.

A claim of priority is made to Korean Patent Application No. 2003-96385 filed on Dec. 24, 2003, the subject matter of which is hereby incorporated by reference.

2. Description of the Related Art

In many applications involving the transmission of various signals, it is critical to accurately reproduce signal timing characteristics upon reception of, or prior to transmission of the signals. That is, the signals must typically be synchronized in their transmission and reception to a standard timing signal (e.g., a clock). A Phase Locked Loop (PLL) or a DLL is commonly used to synchronize the timing characteristics of one or more signals.

The conventional PLL generates a voltage control signal corresponding to a phase difference between an external clock signal and a reproduction clock signal. The phase of the reproduction clock signal is adjusted in relation to the voltage control signal to follow the phase of the external clock signal by means of varying the frequency of the reproduction clock signal.

The conventional DLL similarly generates a voltage control signal corresponding to a phase difference between the external clock signal and the reproduction clock signal, but adjusts a delay period for the reproduction clock signal in response to the voltage control signal to thereby control the phase of the reproduction clock signal such that it follows the phase of the external clock signal.

A DLL is commonly used in digital signal processing systems and synchronous memory devices, such as Synchronous Dynamic Random Access Memory (SDRAM). Common DLL configurations use an inversion scheme that provides a fast locking of signals at the beginning of a phase locking operation.

Figure 1:
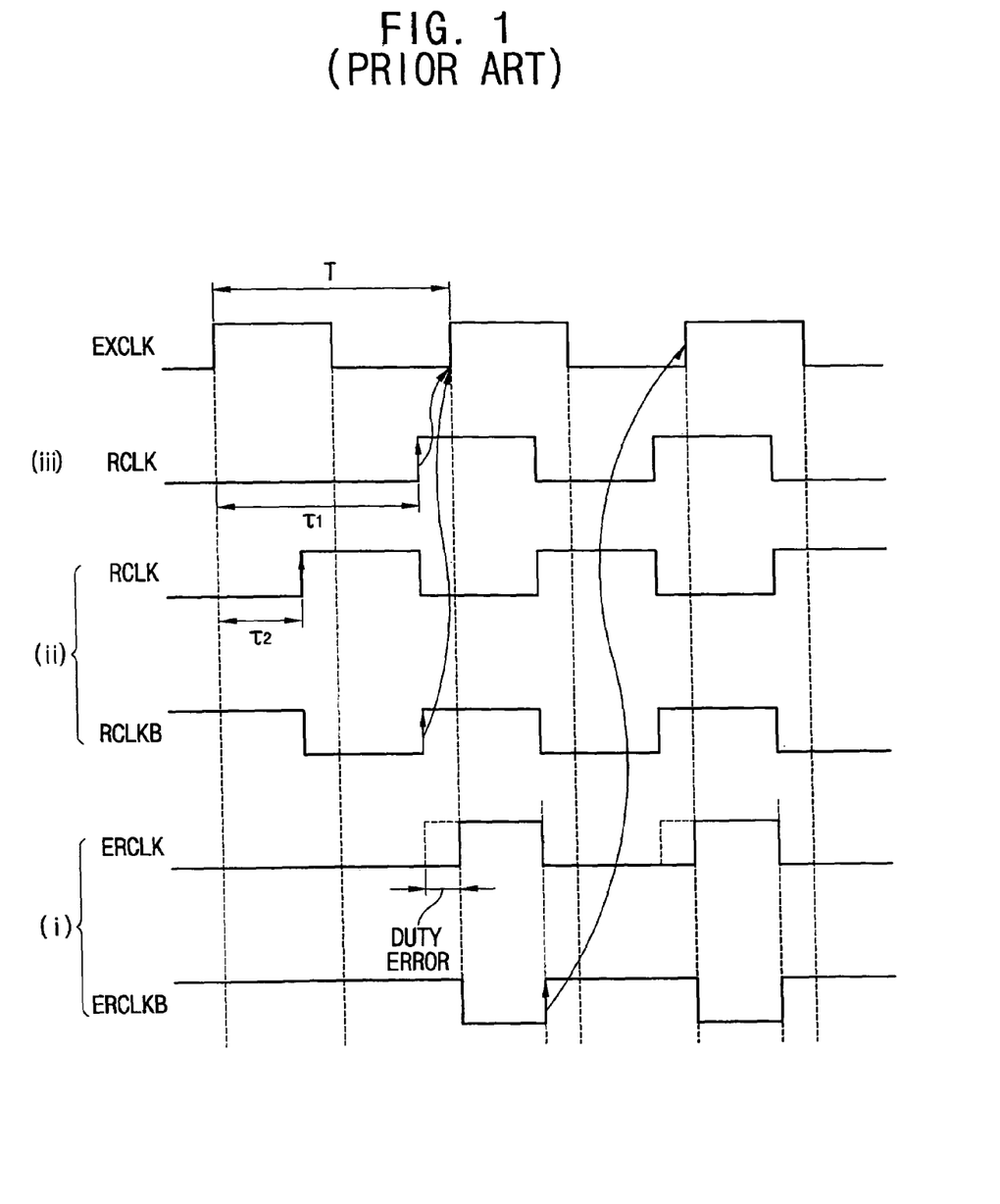
FIG. 1 is a timing diagram showing an inversion scheme and an error caused by a duty error in a conventional DLL.

Referring to FIG. 1, a typical inversion scheme implemented in a DLL circuit compares the phase of a received external clock signal (EXCLK) with the phase of a reproduction clock signal (RCLK) in order to generate (i.e., "output") the reproduction clock signal RCLK without inversion when the phase difference, τ 1, between the clock signals EXCLK and RCLK is greater than one half of a cycle, (i.e., T/2(τ 1<T/2)). (See, timing relationship (iii) in FIG. 1). In contrast, an inverted reproduction clock signal (RCLKB) is output when the phase difference, τ 2, is less than one half of a cycle (i.e., T/2 (τ 2<T/2)). (See, timing relationship (ii) in FIG. 1). Within the foregoing timing relationships, the "following time"(i.e., a delay time) required to lock the rising edge of RCLK to the rising edge of EXCLK can be reduced to no more than half a clock cycle.

However, this is not the case where the duty cycle ratio of RCLK falls below 50%. (See, timing relationship (i) in FIG. 1). In such cases, the reproduction clock signal ERCLK must be delayed by more than half a cycle when inversion is performed because otherwise the phase difference during the next cycle would be mistakenly seen as being less than a half cycle despite the phase difference actually being more than a half cycle.

Thus, DLLs using the inversion scheme experience a problem in that the initial locking time is additionally delayed by as much as the change of the duty cycle ratio for the reproduction clock signal RCLK. Operating speed suffers accordingly when one cycle of the clock signal is larger than a predetermined maximum delay period, and phase unlocking may occur because the locking delay adjustment cannot be performed for such delay periods.

SUMMARY OF THE INVENTION

The present invention provides an inversion control circuit for a DLL and a method for preventing signal inversion within an expanded range of a duty error margin. The present invention also provides a DLL employing a circuit for preventing signal inversion when a duty error arises.

Thus, in one aspect, the present invention provides a circuit for controlling signal inversion in a delay locked loop (DLL) circuit. The circuit comprises an inversion decision circuit configured to compare a received clock signal and a reproduction clock signal, and configured to determine whether an inversion of the reproduction clock signal is necessary to generate an inversion decision signal accounting for a duty error margin in the reproduction clock signal, and an output latch circuit configured to latch the inversion decision signal in synchronization with a start signal to generate an inversion control signal.

In another aspect, the present invention provides a circuit for controlling signal inversion in a delay locked loop(DLL). The circuit comprises an inversion decision circuit configured to compare phases of a received clock signal and a reproduction clock signal to generate an inversion detection signal, a first latch circuit configured to latch the inversion detection signal in synchronization with a start signal to generate a first inversion decision signal, a second latch circuit configured to latch the inversion detection signal in synchronization with the reproduction clock signal after a predetermined period following the start of DLL operation, and configured to generate a second inversion decision signal.

The circuit further comprises a logic circuit configured to generate an inversion control signal including the duty error margin of the reproduction clock signal by combining the first inversion control signal and the inversion control signal.

In yet another aspect, the present invention provides a delay locked loop (DLL) circuit comprising a variable delay line circuit configured to generate a reproduction clock signal following the phase of a received clock signal in response to a delay control signal, a phase detector configured to generate the delay control signal and a phase difference detection signal corresponding to a phase difference between the reproduction clock signal and the received clock signal, wherein the phase detector comprises an inversion controller, wherein the inversion controller determines whether an inversion of the reproduction clock signal is necessary in response to the phase difference detection signal, and synchronizing an inversion decision signal including a duty error margin for the reproduction clock signal with a start signal to output an inversion control signal, and an inversion circuit configured to selectively output one of the reproduction clock signal and an inverted reproduction clock signal in response to the inversion control signal.

In still another aspect, the present invention provides, a synchronous semiconductor memory device comprising a memory cell array, an input terminal configured to receive an external clock signal, a data output terminal, a data output buffer configured to output data read from the memory cell array to the data output terminal in synchronization with the external clock signal in response to an internal clock signal, and a delay locked loop (DLL) circuit.

The DLL circuit may be configured to control a phase inversion across a range of duty error margin for the internal clock signal following the phase of the external clock signal to thereby synchronize the internal clock signal with the external clock signal within a half cycle upon the start of DLL operation.

In still another aspect, the present invention provides a method of controlling signal inversion in a delay locked loop(DLL) circuit. The method comprises detecting a level for an external clock signal at a leading edge of a reconstruction clock signal to output a first level detection signal, producing a delayed reproduction clock signal, detecting a level of the external clock signal at the leading edge of the delayed reproduction clock signal to output a second level detection signal, producing an inversion decision signal including a duty error margin for the reproduction clock signal by logical combination of the first level detection signal and the second level detection signal, and producing an inversion control signal based on the inversion decision signal in synchronization with a start signal.

In still another aspect, the present invention provides a method of controlling signal inversion in a delay locked loop(DLL). The method comprises producing an inversion detection signal based on a phase difference between an external clock signal and a reconstruction clock signal, producing a first inversion decision signal based on the inversion detection signal in synchronization with a start signal, producing a second inversion decision signal based on the inversion detection signal in synchronization with the reproduction clock signal after a predetermined period has passed from start of DLL operation, and producing an inversion control signal including a duty error margin of the reproduction clock signal by logical combination of the first inversion decision signal and the second inversion decision signal.

BRIEF DESCRIPTION OF THE DRAWINGS

The above and other advantages of the present invention will become more apparent by describing in detail the exemplary embodiments thereof with reference to the accompanying drawings, in which.

DESCRIPTION OF THE EXEMPLARY EMBODIMENTS

Detailed illustrative embodiments of the present invention are disclosed herein. These embodiments are presented as teaching examples. The specific structural and functional details disclosed herein are merely representative.

Figure 2:
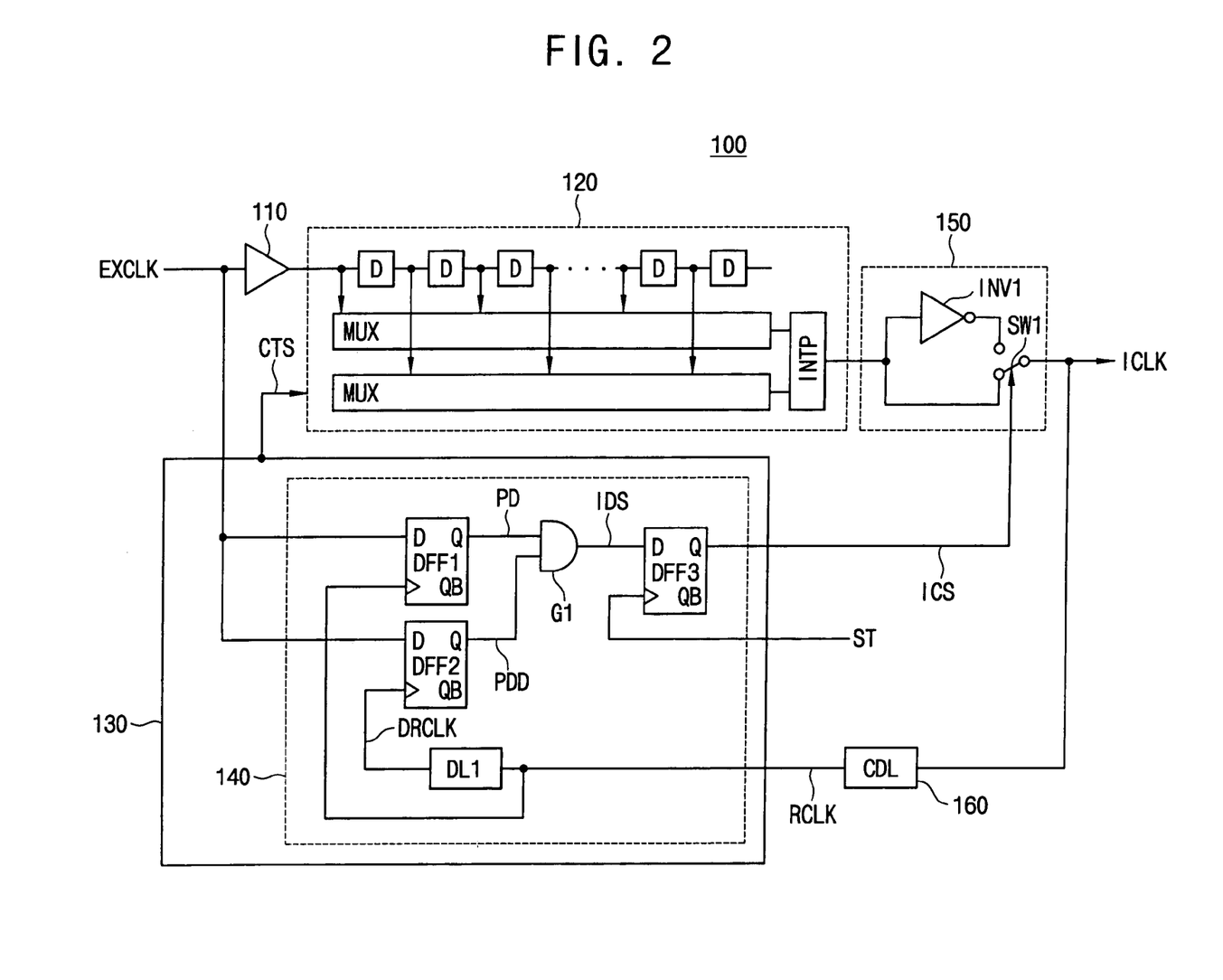
FIG. 2 is a schematic of DLL circuit according to an exemplary embodiment of the present invention.
Figure 3:
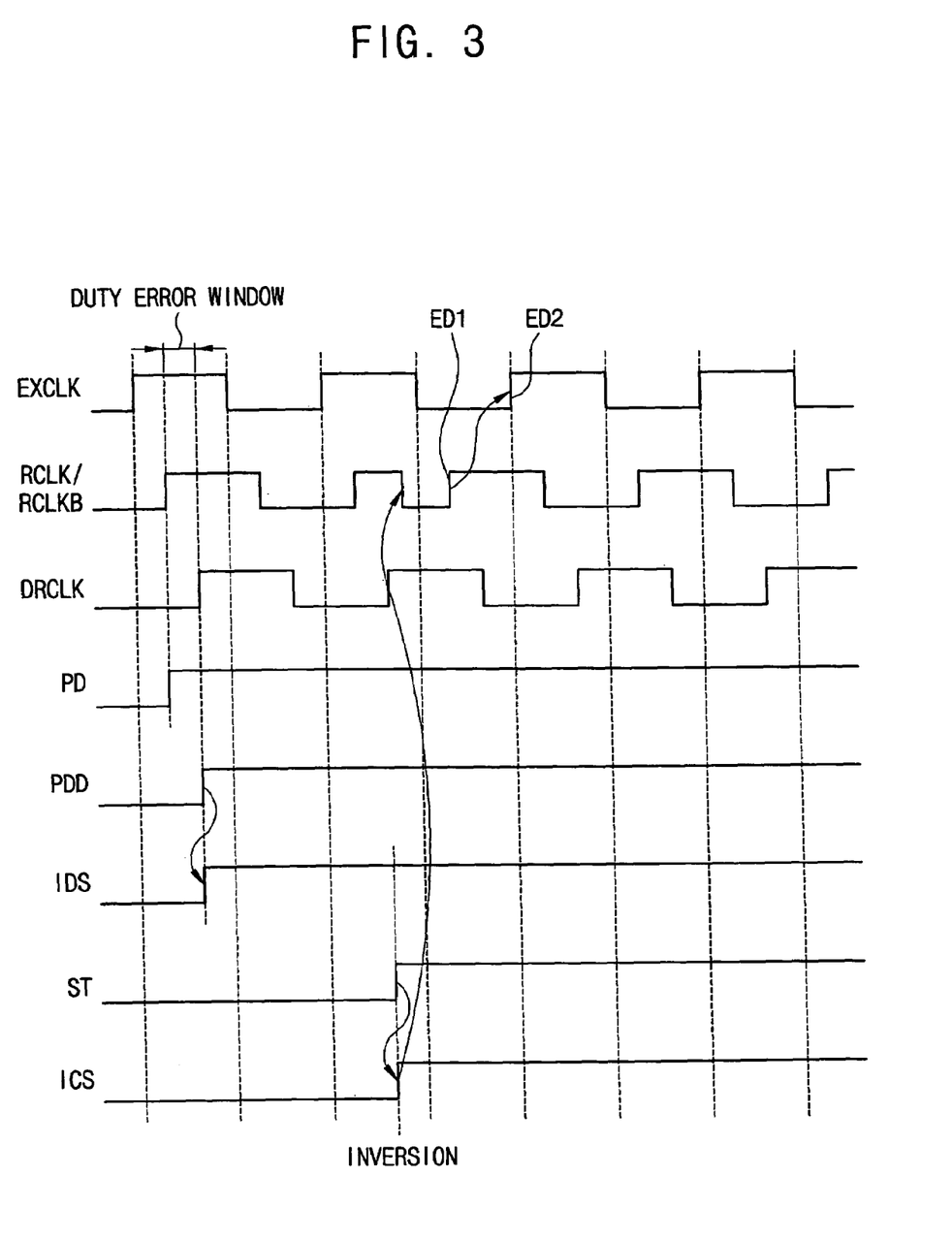
FIG. 3 is a timing diagram showing the inversion operation of the DLL circuit shown in FIG. 2.

FIG. 2 is a schematic of a DLL circuit according to an exemplary embodiment of the present invention. FIG. 3 is a related timing diagram showing signal waveforms at selected points of the DLL circuit shown in FIG. 2.

Referring to FIG. 2, DLL circuit 100 includes an input buffer 110, a variable delay line 120, a phase detector 130, an inversion circuit 150 and a compensation delay circuit 160.

Input buffer 110 receives an external clock signal (EXCLK) and buffers it.

Variable delay line 120 may include a plurality of sequentially coupled delay cells "D", along with twin multiplexers (MUXs) and an interpolator (INTP). The plurality of delay cells sequentially delay the buffered external clock signal by a predetermined unit of delay time in order to generate a plurality of intermediate clock signals. Neighboring intermediate clock signals (before each odd and even stage of the delay cell chain), each having different delay properties, are respectively selected by one of twin multiplexers (MUXs). Interpolator (INTP) interpolates two clock signals received from the twin multiplexers (MUXs), and outputs an interpolated clock signal as an internal clock signal (ICLK).

In its operation, variable delay line 120 delays the internal clock signal (ICLK) in order to phase lock it to the external clock signal (EXCLK) in response to a phase difference detected by phase detector 130.

Phase detector 130 includes an inversion controller 140. Phase detector 130 compares the phases of external clock signal (EXCLK) and a reproduction control signal (RCLK) in order to produce a control signal (CTS) indicative of the phase difference. Control signal CTS is used to control variable delay line 120. The phase detector 130 shown in FIG. 2 is only illustrated in relevant portion and the remaining circuit portions are omitted for the sake of clarity. The reproduction clock signal (RCLK) is produced by compensation delay circuit 160 that performs the compensating delay of internal clock signal (ICLK).

Inversion controller 140 may include an inversion decision circuit and an output latch. The inversion decision circuit may include D-type flip-flops DFF1 and DFF2, a delay circuit DL1 and an AND gate G1. Upon reset, the initial values apparent at the output terminals (Q and QB) of the D-type flip-flops are respectively a logical low level and a logical high level.

The external clock signal (EXCLK) is applied to the data input terminal of DFF1, while the reproduction clock signal (RCLK) is applied to the clock terminal of DFF1. Thus, at the rising edge of the reproduction clock signal (RCLK), a level detection signal related to the external clock signal (EXCLK) is output from the output terminal Q of DFF1. When the external clock signal (EXCLK) is high at the rising edge of reproduction clock (RCLK), a logical HIGH is output, otherwise a logical LOW is output.

External clock signal (EXCLK) is also applied to the data input terminal of DFF2. However, a delayed reproduction clock signal (DRCLK), obtained by delaying the reproduction clock signal (RCLK) by a predetermined period through delay circuit DL1, is applied to the clock terminal of DFF2. Here, delay circuit DL1 provides a delay period at least equal to the duty error margin for reproduction clock signal (RCLK). For example, assuming a clock cycle of 6ns and an allowable duty error margin of about 45:55 (or about 55:45), the delay period may be calculated as 6ns×10%, or approximately 600ps.

Thus, at the rising edge of delayed reproduction clock signal (DRCLK), the signal level of external clock signal (EXCLK) is output from the output terminal Q of DFF2. When the external clock signal (EXCLK) is high at the rising edge of delayed reproduction clock signal (DRCLK), a logical HIGH is output, otherwise a logical LOW is output.

The AND gate G1 logically ANDs the output signal PD from DFF1 and the output signal PDD from DFF2 to produce an inversion decision signal IDS.

Thus, in the present invention, since the inversion decision signal (IDS) is output only after being delayed by the operation of delay circuit DL1, a faulty decision due to the duty error can be prevented.

The output latch may comprise a third D-type flip-flop, DFF3. The inversion decision signal IDS from AND gate G1 and a DLL start signal ST are applied to the data input terminal and clock terminal of DFF3 respectively. Thus, the level detection indicated by the inversion decision signal (IDS) is output from output terminal Q of DFF3 at the rising edge of start signal (ST). When the inversion decision signal (IDS) is high at the rising edge of start signal (ST), a logical HIGH is output, otherwise a logical LOW is output.

Thus, output latch DFF3 provides the inversion decision signal (IDS) as an inversion control signal (ICS) to inversion circuit 150 in response to DLL start signal (ST).

Inversion circuit 150 may include an inverter INV1 configured to invert the variable delay line output signal, and a switch SW1 configured to select between the inverter output signal or the variable delay line output signal. Switch SW1 is switched in response to the inversion control signal (ICS). When the inversion control signal (ICS) is low, then a non-inverted version of the internal clock signal (ICLK) is selected. However, when the inversion control signal ICS is high, an inverted version of the internal clock signal (ICLK) is selected.

Thus, as shown in FIG. 3, where a high inversion decision signal (IDS) is provided as the inversion control signal (ICS) at a rising edge of start signal (ST), reproduction clock signal (RCLK) is inverted and changed to an inverted reproduction clock signal (RCLKB). Thus, the delay period provided by variable delay line 120 is controlled in response to control signal CTS, such that the rising edge (ED2) of external clock signal (EXCLK) may follow the rising edge (ED1) of inverted reproduction clock signal (RCLKB).

Figure 4:
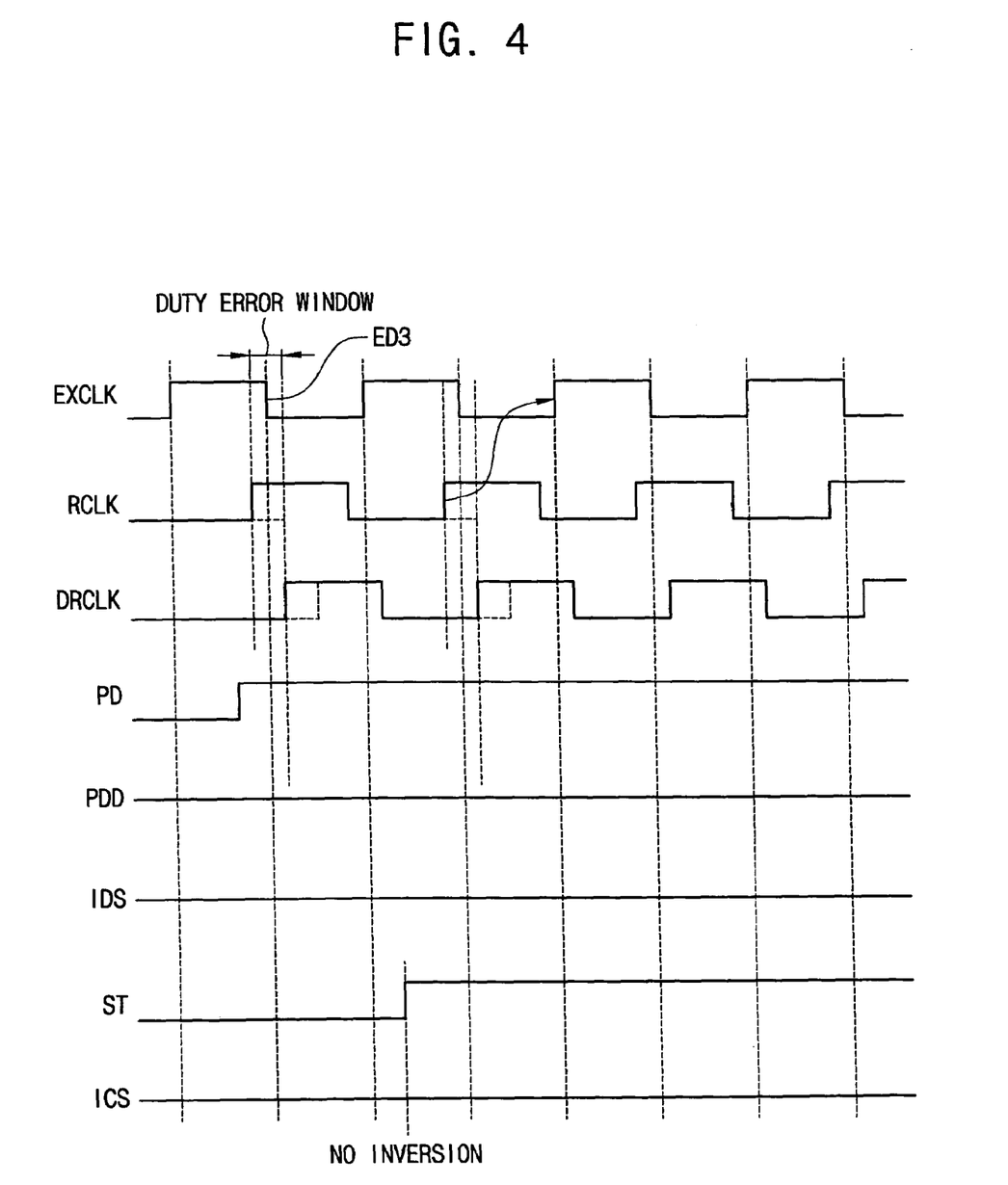
FIG. 4 is a timing diagram showing the non-inversion operation within a range of a duty error margin of FIG. 2.

Referring to FIG. 4, a case where the duty error window covers a falling edge (ED3) of external clock signal EXCLK is shown. Since the output signal PD of DFF1 is high and the output signal PDD of DFF2 is low, the inversion decision signal (IDS) from AND gate G1 becomes low. Thus, the inversion control signal (ICS) also remains low. Accordingly, there is no inversion of the internal clock signal (ICLK) and the reproduction clock signal (RCLK).

Figure 5:
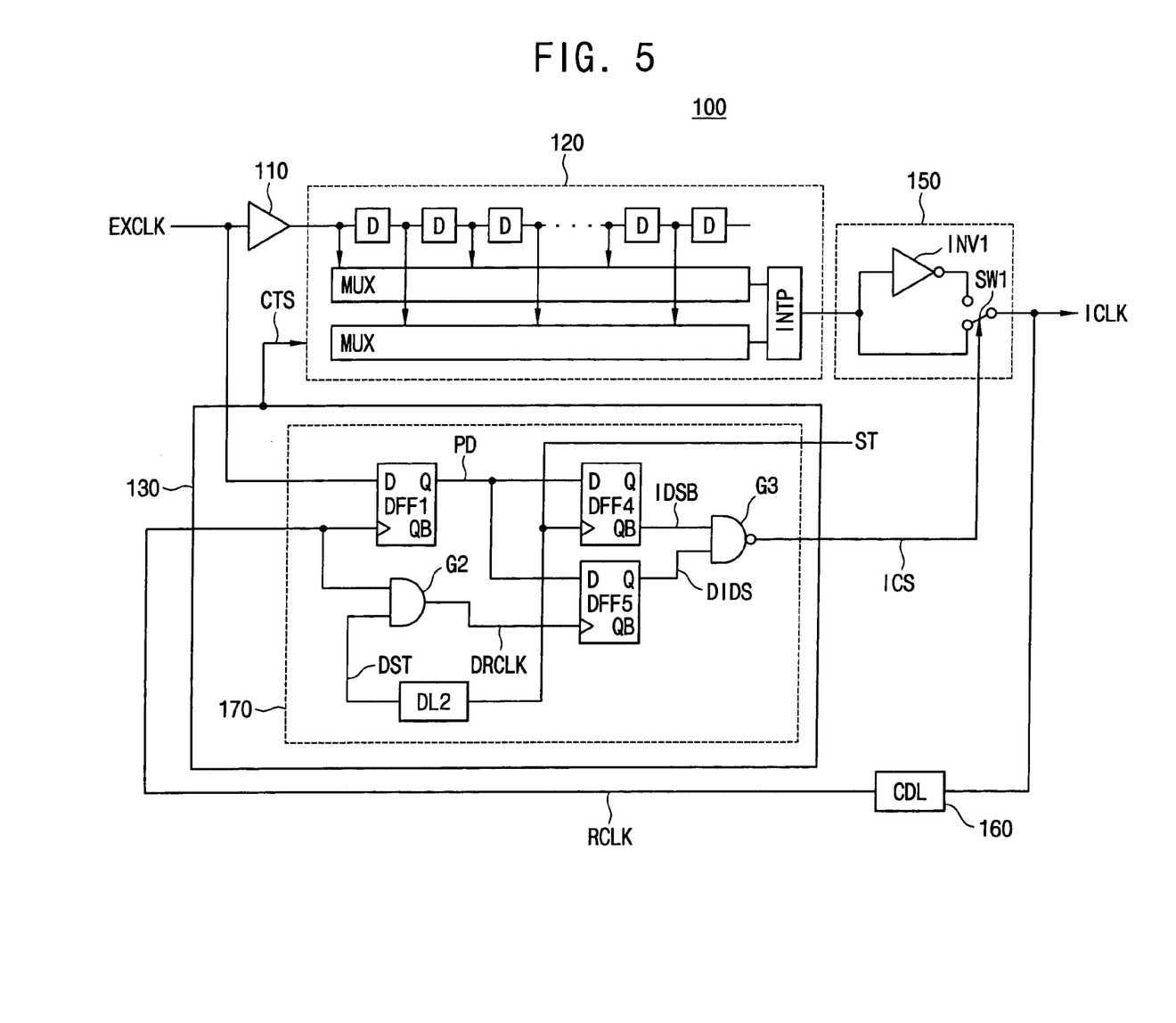
FIG. 5 is a schematic showing a DLL circuit according to another exemplary embodiment of the present invention.

FIG. 5 shows another exemplary embodiment of a DLL circuit according to the present invention. Comparing the DLL circuit of FIG. 5 with the DLL circuit of FIG. 2 reveals a single different, i.e., the configuration of inversion controller 170 relative to the configuration of inversion controller 140. The other elements shown in FIG. 5 are similar in form and function to analogous elements already described with reference to FIG. 2.

Inversion controller 170 includes D-type flip-flops DFF1, DFF4, and DFF5, an AND gate G2, a logic gate G3, and a delay circuit DL2. External clock signal (EXCLK) and the reproduction clock signal (RCLK) are applied to the data input terminal and the clock terminal of DFF1, respectively. Thus, the level of external clock signal (EXCLK) is output from output terminal Q of DFF1 at the rising edge of the reproduction clock signal (RCLK). When external clock signal (EXCLK) is high, a logical HIGH is output, otherwise a logical LOW is output.

Delay circuit DL2 may delay the start signal (ST) by several clock cycles to produce a delayed start signal (DST). The AND gate G2 logically ANDs the reproduction clock signal (RCLK) and the delayed start signal (DST) to produce a delayed reproduction clock signal (DRCLK). Thus, the reproduction clock signal (RCLK) actually becomes the clock signal delayed through delay circuit DL2 to form delayed reproduction clock signal (DRCLK).

The output signal PD from DFF1 and the start signal (ST) are applied to the data input terminal and a clock terminal of DFF4, respectively. Thus, at the rising edge of start signal (ST), the level of output signal PD is output from an output terminal QB of DFF4. When the level of output signal PD is high, a logical LOW is output, otherwise a logical HIGH is output. That is, DFF4 outputs a first inversion decision signal (IDSB) at the starting time point of DLL operation.

The output signal PD and delayed reproduction clock signal (DRCLK) are applied to the data input terminal and a clock terminal of DFF5, respectively. Thus, the level of output signal PD is output from output terminal Q of DFF5 at the rising edge of delayed reproduction clock signal (DRCLK). When output signal PD is high, a logical HIGH signal is output, otherwise a logical LOW signal is output. Flip-flop DFF5 detects whether the level of output signal PD has changed after several clock cycles have lapsed from the starting time point of the DLL circuit's operation.

Logic gate G3 logically combines the first and second inversion decision signals IDSB and DIDS (from DDF5) after several clock cycles from the time the DLL circuit begins operation to produce a final inversion control signal (ICS). Logic gate G3 can be a NAND gate or a NOR gate. Here, it is desirable that the number of delayed clock cycles be selected to form a sufficiently long feedback loop for the inversion result.

That is, when output signal PD from DFF1 is HIGH at the start of DLL circuit operation, then an inversion is performed. When, however, the output signal PD transitions to LOW after several clock cycles from the start of DLL circuit operation, this transition is recognized as a change due to the duty error and the inversion state is continuously maintained.

On the contrary, when the output signal PD remains HIGH after several clock cycles have passed, the inversion is cancelled.

Again comparing to the embodiment of FIG. 2 to that of FIG. 5, there is no need for delaying the reproduction clock signal (RCLK) in and of itself. As a result, a larger duty correction margin is possible.

Figure 6:
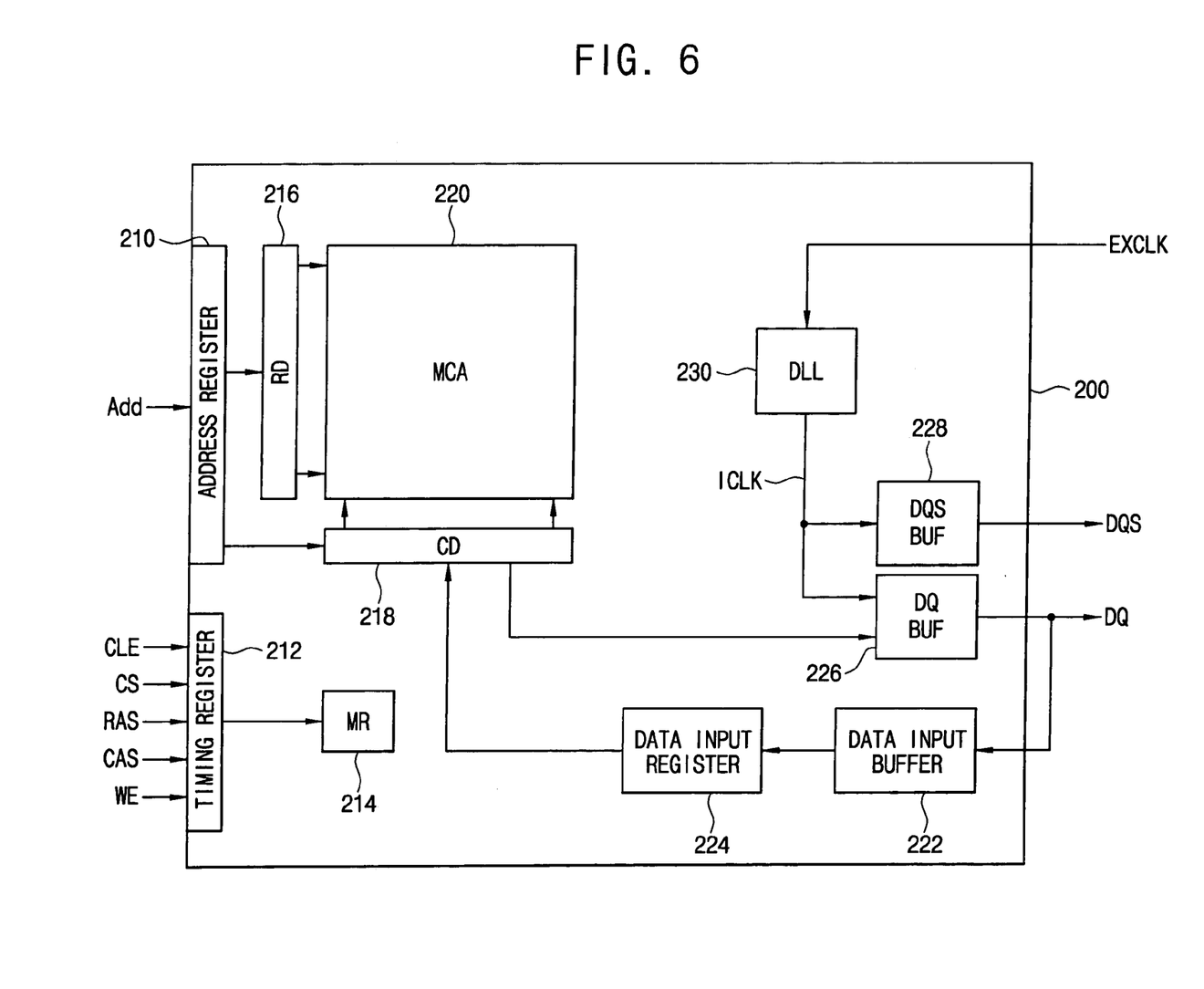
FIG. 6 is a block diagram showing an SDRAM adopting the DLL circuit according to the present invention.
Figure 7:
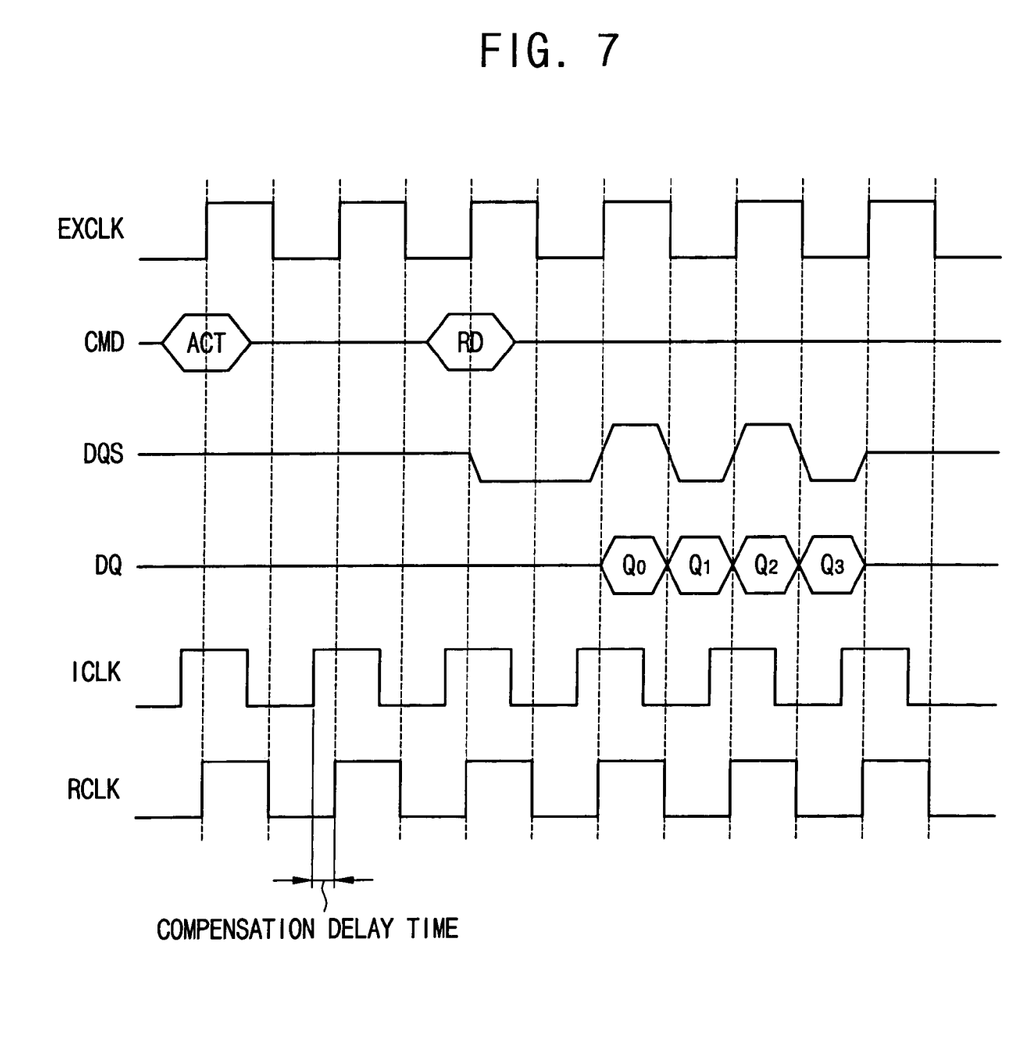
FIG. 7 is a timing diagram showing operation signal waveforms of each part of FIG. 6.

FIG. 6 is a block diagram of an exemplary Synchronous Dynamic Random Accesses Memory (SDRAM) adapted to use a DLL circuit configured in accordance with the present invention. FIG. 7 is timing diagram showing operation signal waveforms from selected points with the SDRAM of FIG. 6.

The SRAM 200 generally includes an address register and buffer 210, a timing register 212, a mode register 214, a row decoder 216, a column decoder 218, a memory cell array 220, a data input buffer 222, a data input register 224, a data output buffer 226, a data strobe output buffer 228 and a DLL 230.

SDRAM 200 outputs data in synchronization with an external clock signal. Thus, SDRAM 200 includes a DLL configured to produce an internal clock signal which follows the phase of the external clock signal, and further configured to control data output buffer 226 and data strobe output buffer 228 in response to the thus-produced internal clock signal.

As shown in FIG. 7, the phase internal clock signal (ICLK) is advanced in relation to external clock signal (EXCLK) by some delay time. Thus, a compensation delay circuit in the DLL delays the internal clock signal (ICLK) by a corresponding delay to thereby synchronize the phase of the internal clock signal (ICLK) with the phase of external clock signal (EXCLK). That is, the compensation delay circuit in the DLL delays for some determined period the output data through a data path to an output pad.

Thus, as shown in FIG. 7, the phases of a data strobe signal (DQS), a data output signal (DQ) and the reproduction clock signal (RCLK) are controlled to be synchronized with the phase of external clock signal (EXCLK).

In order to synchronize the phases of data strobe signal (DQS), data output signal (DQ) and reproduction clock signal (RCLK) with the phase of external clock signal (EXCLK), a DLL circuit operating in accordance with the premises explained in relation to the foregoing exemplary embodiments may be used.

Generally, a DLL circuit in SRAM 200 is driven in the manner that the DLL is turned-off in a stand-by mode, and is turned-on in an active mode in order to reduce power consumption. Thus, in the DLL, the inversion scheme is used for fast locking operation when the DLL is turned-on. Thus, the present invention can prevent locking failure in the DLL due to an inversion error. While the exemplary embodiments of the present invention and their advantages have been described in some detail, it should be understood that various changes, substitutions and alterations may be made to these example without departing from the scope of the invention which is defined by the claims that follow.

What is claimed is:

1. A circuit for controlling signal inversion in a delay locked loop (DLL) circuit comprising:
    an inversion decision circuit configured to compare a received clock signal and a reproduction clock signal, and configured to determine whether an inversion of the reproduction clock signal is necessary to generate an inversion decision signal accounting for a duty error margin in the reproduction clock signal; and
    an output latch circuit configured to latch the inversion decision signal in synchronization with a start signal to generate an inversion control signal.

2. The circuit of claim 1, wherein the inversion decision circuit comprises:
    a first latch circuit configured to latch a level of the received clock signal at a leading edge of the reproduction clock signal to output a first level detection signal;
    a delay circuit configured to generate a delayed reproduction clock signal;
    a second latch circuit configured to latch a level of the received clock signal at a leading edge of the delayed reproduction clock signal to output a second level detection signal; and
    a logic circuit configured to generate the inversion decision signal including the duty error margin of the reproduction clock signal by combination of the first level detection signal and the second level detection signal.

3. The circuit of claim 2, wherein the logic circuit comprises an AND gate.

4. The circuit of claim 2, wherein the delay circuit provides a delay period at least equal to the duty error margin in the reproduction clock signal.

5. The circuit of claim 2, wherein the first and second latch circuits each comprise a D-type flip flop.

6. The circuit of claim 1, wherein the output latch circuit comprises a D-type flip flop, and wherein the inversion decision signal and the start signal are applied to a data input terminal and a clock terminal of the D-type flip flop, respectively.

7. The circuit of claim 1, wherein the DLL circuit further comprises:
    an input buffer adapted to buffer and output the received clock signal;
    a variable delay line adapted to delay and output the received clock signal output from the input buffer;
    an inversion circuit adapted to selectively invert the received clock signal output from the variable delay line based on the inversion decision signal to generate an internal clock signal; and,
    a compensation delay signal adapted to perform a compensating delay of the internal clock signal generated by the inversion circuit to generate the reproduction clock signal.

8. A method of controlling signal inversion in a delay locked loop(DLL) circuit, comprising:
    detecting a level for an external clock signal at a leading edge of a reconstruction clock signal to output a first level detection signal;
    producing a delayed reproduction clock signal;
    detecting a level of the external clock signal at the leading edge of the delayed reproduction clock signal to output a second level detection signal;
    producing an inversion decision signal including a duty error margin for the reproduction clock signal by logical combination of the first level detection signal and the second level detection signal; and
    producing an inversion control signal based on the inversion decision signal in synchronization with a start signal.

9. The method of claim 8, wherein detecting the level for the external clock signal at the leading edge of the reconstruction clock signal comprises latching the external clock signal at the leading edge of the reconstruction clock signal.

10. The method of claim 8, wherein detecting the level of the external clock signal at the leading edge of the delayed reproduction clock comprises latching the external clock signal at the leading edge of the delayed reconstruction clock signal.

11. The method of claim 8, wherein the logical combination of the first level detection signal and the second level detection signal is accomplished by a logical AND operation.

12. The method of claim 8, wherein producing the inversion control signal based on the inversion decision signal in synchronization with a start signal comprises latching the inversion decision signal in synchronization with the start signal.

* * * * *